United States Patent [19]

Brajder

[11] 4,239,989
[45] Dec. 16, 1980

[54] METHOD AND APPARATUS FOR DRIVING A TRANSISTOR OPERATED IN SATURATION

[75] Inventor: Antonio Brajder, Erlangen, Fed. Rep. of Germany

[73] Assignee: Siemens Aktiengesellschaft, Berlin and Munich, Fed. Rep. of Germany

[21] Appl. No.: 837,805

[22] Filed: Sep. 29, 1977

[30] Foreign Application Priority Data

Oct. 1, 1976 [DE] Fed. Rep. of Germany ....... 2644507

[51] Int. Cl.³ .............................................. H03K 17/00
[52] U.S. Cl. .................................... 307/255; 307/254; 307/270; 307/300
[58] Field of Search ............... 307/300, 270, 315, 255, 307/317 A, 200

[56] References Cited

U.S. PATENT DOCUMENTS

| | | | |
|---|---|---|---|
| 3,056,064 | 9/1962 | Bourqet | 307/300 |
| 3,194,979 | 7/1965 | Toy | 307/300 |
| 3,244,910 | 4/1966 | Leifer | 307/255 |
| 4,017,115 | 7/1977 | Lee | 307/317 A |

OTHER PUBLICATIONS

Semiconductor Fundamentals Devices and Circuits, John Wiley & Sons, Inc., New York, pp. 217 & 218.

*Primary Examiner*—Stanley D. Miller, Jr.
*Assistant Examiner*—B. P. Davis
*Attorney, Agent, or Firm*—Kenyon & Kenyon, Reilly, Carr & Chapin

[57] ABSTRACT

A method and apparatus for driving a transistor wherein a control voltage and a cut-off voltage are applied to the base of the transistor to cause the transistor to conduct current and to cut-off, respectively, and wherein, preceding the application of the cut-off voltage, a further voltage is applied to the base of the transistor for a predetermined desaturation time interval $\Delta t$ which depends upon the storage or delay time of the transistor. In accord with the invention, the aforesaid further voltage corresponds to the voltage at which the current at the base of the transistor is approximately zero.

10 Claims, 3 Drawing Figures

METHOD AND APPARATUS FOR DRIVING A TRANSISTOR OPERATED IN SATURATION

BACKGROUND OF THE INVENTION

Field of the Invention

The invention relates to a method and apparatus for driving at least one transistor operated in saturation wherein a control voltage and a cut-off voltage are applied to the base of the transistor for causing the transistor to conduct current and cut-off respectively, and wherein the voltage applied to the base of the transistor is switched from the control voltage to the cut-off voltage for the purpose of shutting off the transistor.

Power transistors are frequently operated in the saturated state, for example, when they are driven as switching transistors. During this saturated or overdriven state, the so-called "collector diode" of the transistor is poled in the conduction direction. As a result, the charge carrier density is increased at the collector-side edge of the base zone and the number of charge carriers stored in the base is considerably larger than in the unsaturated state.

When the transistor is switched or cut-off, these excess charge carriers must necessarily flow off first. The level of the collector current, therefore, remains unchanged until the density of the charge carriers at the collector barrier layer has dropped off to the point at which the collector diode is again cut-off. Thus, only after a time interval which is called the storage or delay time does the collector current begin to recede, at which time it then quickly approaches its static residual current. This means, of course, that a delay occurs in the shutting-off of a transistor operated in saturation.

One particular circuit for driving a power transistor operated in saturation is presently being marketed wherein the transistor of a driver stage is connected in series with the base of the power transistor, and the base of the power transistor is connected via a further resistor to a terminal to which a cut-off voltage is applied. In this circuit, this power transistor is brought into conduction and carries the load current when the transistor of the driver stage is driven or conducting. When the transistor of the driver stage is cut-off or non-conducting the cut-off voltage is applied to the base of the power transistor via the terminal thereby shutting-off the power transistor. At this time, a negative base current flows out of the power transistor, whereby the latter is first desaturated and then shut-off. In order to obtain rapid shut-off with low losses, the resistor connecting the cut-off voltage terminal to the base of the power transistor must have a low resistance. As a result, a large part of the control current flowing via the transistor of the driver stage during conduction of the power transistor flows to the cut-off voltage terminal. This, in turn, significantly increases the power required for operation.

A further circuit for driving a power transistor operated in saturation is also being marketed wherein the base of the power transistor is connected, on the one hand, via a resistor, to a terminal to which a control voltage is being applied and, on the other hand, via the collector-emitter path of a further transistor, to a terminal to which a cut-off voltage is being applied. This further transistor is called a shut-off or depletion transistor. In this circuit, the power transistor becomes conducting and carries the load current when the shut-off transistor is cut-off. During this time, the base current flows through the resistor connecting the base of the power transistor to the control voltage terminal. To shut-off the power transistor, the shut-off transistor is driven into conduction and thereby, the cut-off voltage is applied to the base of the power transistor. Thus, a negative current flows out of the base of the power transistor, whereby the latter is first desaturated and then switched off. During the desaturation and shut-off phase of the power transistor, the shut-off transistor carries a current, to which are added the negative base current and the current which flows through the resistor connecting the base of the power transistor to the control voltage terminal. Thus, in this circuit, the shut-off transistor must be designed and driven so that it can carry the negative base current, which may be several times larger than the positive base current. In addition, control power is unnecessarily consumed during the entire cut-off time of the power transistor, as the shut-off transistor remains driven and, therefore, control current flows via the series resistor.

Another circuit for driving a power transistor is being marketed wherein a driven stage includes a switch in the form of a push-pull circuit comprised of transistors for switching a control voltage and a cut-off voltage to and from the base of the power transistor. In this circuit, the power transistor becomes conducting and carries the load current when the appropriate transistor of the push-pull circuit is conducting and the other one is cut-off. For shutting off the power transistor, the conducting transistor of the push-pull circuit is cut-off and the heretofore cut-off transistor is driven, whereby the latter transistor carries the negative base current during the desaturation and shutting-off phase. This circuit has the advantage that control current flows only during the conduction phase of the power transistor and, therefore, control power is not consumed unnecessarily. It has the disadvantage, however, that the transistor of the push-pull circuit which is being driven during the shutting off of the power transistor carries the negative base current during the entire storage time of the power transistor and, hence, must be driven and designed accordingly. It may be further necessary with this circuit for a defined shutting-off of the power transistor to design the circuit such that the negative base current rises with a defined slope or rate of change (di/dt), which adds to the cost of the circuit.

It is an object of the present invention to provide a method and apparatus for driving a transistor such that the transistor is shut off with low losses, with a minimum of control power and in a defined time interval.

SUMMARY OF THE INVENTION

In accordance with the principles of the present invention the above and other objectives are accomplished in an apparatus and method wherein a control voltage and cut-off voltage are applied to the base of a transistor for causing the transistor to conduct current and to cut-off respectively, and wherein, prior to the application of the cut-off voltage, a further voltage which corresponds to the voltage at which the base current of the transistor is approximately zero, is applied to the base of the transistor for a predetermined desaturation time interval which depends upon the storage time of the transistor. In particular, during the predetermined time interval a voltage which corresponds approximately to the cut-off voltage can be applied to the base of the transistor.

In the method and apparatus of the invention, therefore, the voltage at the base of the transistor is not switched directly from the control voltage to the cut-off voltage for shutting off the transistor, but instead for a predetermined desaturation time interval after disconnecting the control voltage, a further voltage is first applied to the base which is of a value which causes the base current to be in the order of zero. Thereafter, the cut-off voltage is applied to the base.

During the aforesaid desaturation time interval, the collector current of the transistor continues to flow unimpeded due to the stored charge present in the transistor. Moreover, the transistor desaturates itself as no control current flows from the base. The losses that occur in the transistor during the desaturation interval, thus, do not differ substantially from the losses that occur in the transistor during the state of conduction for positive base current. At the end of the desaturation interval and after the cut-off voltage is subsequently applied to the base of the transistor, a negative base current begins to flow against the cut-off voltage. As the transistor has already been desaturated either completely or to a large extent by this time, the resultant negative base current which flows is now much smaller and the switching-off time of the transistor is noticeably shorter than would otherwise be the case. This, in turn, results in a shorter decay time for the collector current and thus smaller shutting-off losses. In addition, driving currents and power can be less. Finally, the total control power is decreased, as control current flows only during the conduction state of the transistor. This is of particular interest for high frequency switching applications of the method and apparatus of the invention, where the desaturation phase of the transistor is no longer negligible relative to the conduction phase of the transistor. It should be further noted that when several power transistors are connected together, for example, in push-pull circuits, where the different storage or delay times of the transistors would lead to saturation phenomena in transformers during shut-off, a better symmetry of the voltage-time areas can be achieved by driving the transistors according to the method and apparatus of the invention.

The method of the present invention can be used to operate a drive system for a transistor wherein the system comprises a driver stage which is coupled to the base of the transistor and includes a plurality of further transistors arranged in a push-pull circuit configuration. In this application of the method, the steps of applying the control voltage and the cut-off voltage are carried out by selectively turning-on and turning-off the further transistors and the step of applying the further voltage is carried out by turning off all of the further transistors during the desaturation time interval. Thus, a particularly simple implementation of the method according to the invention is possible with this drive system. Furthermore, in using the method of the invention to operate this system at least the further transistor of the push-pull circuit which is driven during the shutting off operation can be designed for a smaller current and the drive power can be substantially smaller than with the operation of the drive system in the conventional manner.

In one form of the apparatus of the invention, the apparatus comprises a first means for coupling to its output the control voltage, cut-off voltage and the further voltage and a second means for controlling the first means such that the appearance of the cut-off voltage at the output is preceded by the appearance of the further voltage at the output for the desaturation time interval. In a particular embodiment of the aforesaid form of the apparatus of the invention, the first means comprises a double-throw switch and the apparatus further includes a capacitor which connects the output of the switch to the base of the transistor. This capacitor is charged during the conducting state of the transistor in such a manner that its electrode connected to the base of the transistor is about at the base voltage of the transistor. When the double-throw switch is controlled by the second means to couple the cut-off voltage to its output, a voltage is impressed on the base of the transistor which is more negative than the cut-off voltage by the amount of the capacitor voltage. This further shortens the decay time of the collector current while negative base current flows. The use of such a capacitor is particularly advantageous when a negative voltage is not available for use as the cut-off voltage.

In a further embodiment of the aforesaid form of the apparatus of the invention, the first means of the apparatus includes a double-throw switch and a high resistance connected to the output of the switch and adapted to be connected to the cut-off voltage. With this embodiment, a defined voltage is obtained at the base of the transistor during the desaturation interval in a simple manner. Additionally, through appropriate choice of the resistance of the resistor, the base current can be maintained at approximately zero. Moreover, through further adjustment of this resistance, a somewhat negative base current can be generated during the desaturation interval, whereby the desaturation interval, and, therefore, the switching-off time of the transistor can be shortened further. In choosing the resistance value, consideration should be given to the fact that part of the control current flows through this resistor during the conducting state of the transistor.

In still another embodiment of the aforesaid form of the apparatus of the invention, the apparatus is used for driving a plurality of further transistors arranged in a Darlington circuit. More particularly, the output of the first means is connected to the driver transistor of the Darlington circuit and the apparatus is further provided with a diode adapted to be connected between the base of the driver transistor and the base of the output transistor of the Darlington circuit, the latter diode being poled in the forward direction of the emitter-collector path of the driver transistor. Advantageously, the aforesaid diode may be a Schottky diode. With the diode included in the apparatus, the desaturation time of the output transistor is shortened. More particularly, such desaturation takes place not only during the desaturation time interval, but also subsequently after the cut-off voltage is applied.

It should be noted that the previously described use of a capacitor and high value resistance in the apparatus of the invention is also applicable in the last-mentioned embodiment of the invention.

BRIEF DESCRIPTION OF THE DRAWINGS

The above and other features and aspects of the present invention will become more apparent upon reading the following detailed description in conjunction with the accompanying drawings, in which.

DETAILED DESCRIPTION

Figure 1:
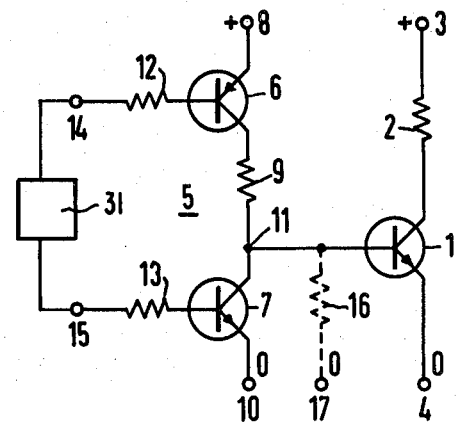
FIG. 1 shows an apparatus for carrying out a method in accordance with the principles of the present invention.

FIG. 1 shows schematically the circuit diagram of an apparatus for driving a transistor 1 operated in saturation. The transistor 1 typically might be a switching transistor in a power supply. As shown, the collector of the transistor 1 is connected, via a load resistor 2, to a terminal 3 to which is applied a positive voltage. The emitter of the transistor 1, in turn, is connected to a terminal 4 to which a reference voltage is applied. A driver stage 5 precedes the base of the transistor 1 and includes transistors 6 and 7 arranged in a conventional push-pull circuit configuration. More particularly, as shown, the emitter of the transistor 5 is connected to a terminal 8 which receives a positive control voltage. The collector of the transistor 6, in turn, is connected, via the resistor 9, to the collector of the transistor 7, and the emitter of the transistor 7 is coupled to a terminal 10 to which is applied a cut-off voltage which may be negative. In the illustrative embodiment, the cut-off voltage is the same as the reference voltage.

The base of the transistor 1 is connected to the junction point 11 between the resistor 9 and the transistor 7. The base of the transistor 6 is acted upon, via a resistor 12, and the base of the transistor 7, via a resistor 13, by control voltages which are coupled to the terminals 14 or 15, respectively, via a control voltage source 31.

Figure 2:
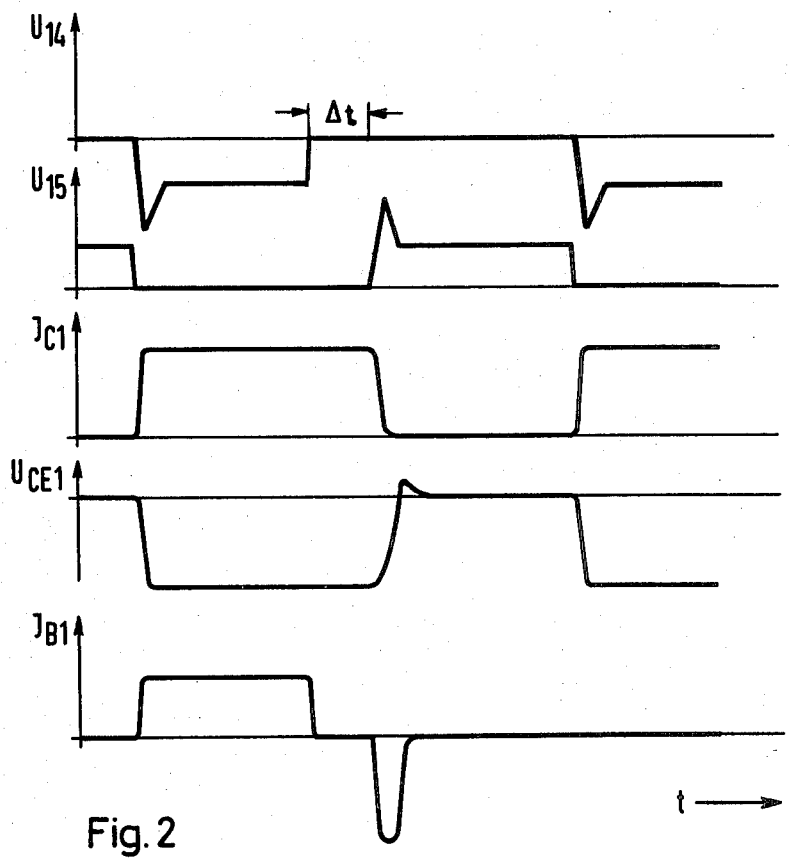

The voltages generated by the control voltage source 31 cause the driver stage 5 to operate to drive the transistor 1 in accordance with the principles of the invention as will now be explained in detail with reference to the waveform diagrams of FIG. 2. More particularly, in FIG. 2, the voltage waveforms $U_{14}$ and $U_{15}$ represent the voltages generated by the source 31 and, hence, the control voltages present at the terminals 14 and 15. The current $I_{C1}$, the voltage $U_{CE1}$ and the current $I_{B1}$, in turn, represent the collector current, the collector voltage and the base current of the transistor 1 resulting from application of the control voltages $U_{14}$ and $U_{15}$ to the driver stage 5. More particularly, when the voltage $U_{14}$ at the terminal 14 is negative and the voltage $U_{15}$ at the terminal 15 is zero, the transistor 6 is conducting and the transistor 7 is cut-off. As a result, control current applied at the terminal 8 and carried by the conducting transistor 6 is coupled to the base of the transistor 1, thereby bringing the transistor into a conducting saturated state.

In accordance with the invention, before the transistor 1 is switched from the aforesaid conducting state to a shut-off state, the voltages $U_{14}$ and $U_{15}$ are controlled so as to cause the transistors 6 and 7 to result in a voltage at the junction 11 corresponding to the voltage for which the current to the base of the transistor 1 is approximately zero. More particularly, the voltage $U_{14}$ is changed to zero and the voltage $U_{15}$ is retained at zero, whereby both the transistors 6 and 7 are placed in a cut-off state and the voltage at junction 11 results in approximately zero current being delivered to the base of the transistor 1. The transistors 6 and 7 remain in such cut-off state for a time interval $\Delta t$, during which the base current $I_{B1}$ to the base of the transistor 1 remains at approximately the aforesaid zero level. However, the load current $I_{C1}$ at the collector of the transistor 1 remains at its previous level, due to the stored charge of the transistor 1, without an appreciable increase in the forward voltage.

As can be appreciated during the interval $\Delta t$, the transistor 1 becomes desaturated by itself without additional losses occurring in the circuit. At the end of the time interval $\Delta t$, which is referred to as the desaturation time interval, the transistor 7 is turned on by the change of the voltage $U_{15}$ to a positive voltage, while the transistor 6 remains non-conducting or cut-off. At this time, collector current $I_{C1}$ begins to drop and a negative base current flows due to the cut-off voltage applied to the base of the transistor 1. Due to the previous desaturation of the transistor 1, the aforesaid negative base current is, however, substantially smaller than would be the case for conventional operation of the apparatus of FIG. 1. Also the decay time of the collector current becomes substantially smaller than would otherwise be the case. After the transistor 1 is shut-off, the transistor can be switched back into the current-conducting state by again cutting off the transistor 7 and turning on the transistor 6.

With the method and apparatus of the invention, a low-loss shut-off of the transistor 1 is thus achieved, since practically no additional losses occur during the desaturation phase. Also the total control power is reduced, as the control current flows, via the transistor 6, only during the current-conducting state of the transistor 1, and the control power for the transistor 7 is substantially reduced, since the latter needs to carry a substantially smaller negative base current. In addition, the shut-off of the transistor 1 occurs in a defined, short time, which is composed of the desaturation time interval $\Delta t$ and the subsequent decay time of the collector current.

The desaturation time $\Delta t$ depends on the storage or delay time of the transistor 1 and must be fixed in accordance with the transistor type used. In order to avoid selecting a desaturation time interval $\Delta t$ which exceeds the storage time of a particular type transistor one can determine, by means of a measurement of the collector voltage of the transistor 1, the point in time at which the charge carrier density at the edge of the base zone on the collector side has dropped and desaturation has, therefore, occurred. At such time, a positive value of the control voltage $U_{15}$ can be applied to the base of the transistor 7, thereby initiating the shutting-off process. In such case, one obtains an optimally short switching-off time for the transistor 1, which is not affected by different storage times.

In the apparatus of FIG. 1, the base of the transistor 1 is further connected, via a resistor 16, shown dashed, to a terminal 17, to which the cut-off voltage which, in the present case, is equal to the reference voltage, is applied. With the inclusion of the aforesaid resistor, an unequivocal voltage is impressed on the base of the transistor 1 during the desaturation interval. Moreover, by selecting the resistor to have an appropriately high resistance, practically no negative base current will flow during the desaturation time interval $\Delta t$ and, therefore, the voltage at the base will be retained at the level at which the current remains at approximately zero. However, the value of the resistance of the resistor 16 can also be selected such that during the desaturation time interval $\Delta t$, a relatively small negative base current flows which accelerates the desaturation and, thereby, shortens the desaturation time interval without a noticeable increase of the shutting-off time. In such case, the resistance of the resistor 16 must, of course, be optimized so that the negative base current is sufficiently large and the portion of the control current which flows off via the resistor 16 during the conducting state of the transistor 1 is sufficiently small, so that a sufficient acceleration of the switching-off process is obtained, while the total control power and the switching-off losses increase only insignificantly.

Figure 3:
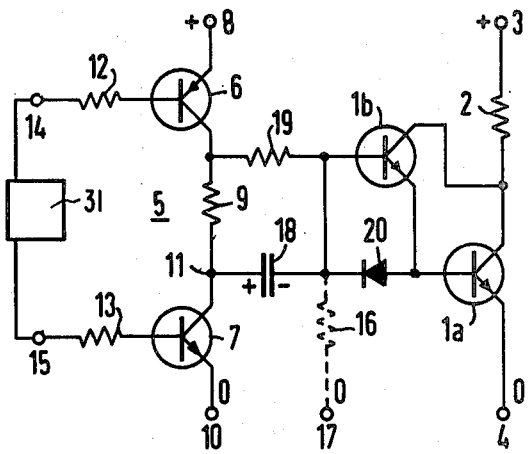
FIG. 2 illustrates signal waveforms of the apparatus of FIG. 1 when operated to carry out the method of the invention and FIG. 3 shows an apparatus in accordance with the principles of the present invention.

FIG. 3 shows a modified form of the apparatus of the invention wherein the transistor 1 is replaced by a Darlington circuit comprising an output transistor 1a and the driver transistor 1b, the latter transistor being driven by the apparatus of the invention. The apparatus of FIG. 3 differs from the apparatus of FIG. 1 in that the junction point 11 at the collector of the transistor 7 is connected to the base of the driver transistor 1b via a capacitor 18. In addition, the transistor 6 is connected via the resistor 19 likewise to the base of the driver transistor 1b. While not shown, to prevent the capacitor 18 from being discharged, a decoupling diode can be connected in series with the resistor 9.

In operation, the transistor 6 is driven into conduction and the transistor 7 is cut-off so that the control current for the driver transistor 1b now flows via the resistor 19, thereby turning the driver transistor and, hence, the output transistor 1a on. At the same time, the capacitor 18 is charged up with the polarity indicated and the electrode of the capacitor 18 which is connected to the base of the transistor 1b is at the base voltage. In order to switch off the transistor 1b and, hence, the transistor 1a, the transistors 6 and 7 are first both rendered non-conducting for the desaturation interval $\Delta t$ and, thereafter, the transistor 6 is kept non-conducting and the transistor 7 is driven. At such time, the voltage at the junction point 11, which voltage is approximately at the cut-off voltage, is added to the negative voltage across the capacitor 18 and the total voltage is then impressed on the base of the transistor 1b. As a result, during cut-off, the negative base current is increased and the decay time of the collector current is shortened without substantially increasing the switching-off losses nor the control power.

The capacitor 18 further brings about a delay-free transmission of the rising flank of the pulse by which the transistor 1b is driven. For, at the switching instant, i.e., when the rising flank of the driving voltage occurs, the capacitor 18 acts as a short circuit and allows the voltage jump to become fully effective at the base of the transistor 1b. The rising flank of the collector current of the output transistor 1a, therefore, takes place very steeply, and the transistor 1a is overdriven. If the steady state has been reached and the capacitor 18 is charged in the manner indicated, the flowing base current is determined by the resistor 19.

It has already been mentioned that in the embodiment of the invention of FIG. 3, the transistor 1 has been replaced by a Darlington circuit comprising the transistors 1a and 1b. It should be noted that, in principle, the Darlington circuit can be driven in accordance with the principles of the invention without the use of the resistor 19 and capacitor 18 in the apparatus of FIG. 3. In such case, the driver transistor 1b is desaturated during the desaturation time interval $\Delta t$ to a point where no base current flows for the transistor, at which time the desaturation of the driver transistor 1a begins. Following the latter, the shutting-off is accomplished via the transistor 7 as discussed above. In this mode of operation, the desaturation of the transistor 1a can be shortened substantially if the base of the transistor 1a is connected to the base of the transistor 1b via a diode 20 which is poled in the forward direction of the collector-emitter path of the transistor 1b. With the diode 20 present, the length of the desaturation interval $\Delta t$ should be selected in accordance with the storage time of the driver transistor 1b and at least part of the storage time of the output transistor 1a. The final desaturation of the output transistor 1a takes place with the transistor 7 being driven into conduction, whereby the driver transistor 1b is also switched off. Although in this case, a relatively large negative base current, via the diode 20, is obtained which flows via the switching-off transistor 7, the shutting-off losses and the total control power are still reduced substantially over conventionally operated circuits. Preferably, a Schottky diode can be used for the diode 20. With such a diode in the cut-off phase, the base of the output transistor 1a is practically at the voltage of the terminal 10.

What is claimed is:

1. A method for driving at least one transistor which is operated in saturation comprising:
    applying a control voltage to the base of said transistor for operating said transistor in a current-conducting state;
    applying a cut-off voltage to the base of said transistor for operating said transistor in a cut-off state;
    and preceding the application of said cut-off voltage, applying a further voltage for a predetermined desaturation time interval which depends upon the storage time of said transistor to the base of said transistor, said further voltage corresponding to the voltage at the base of said transistor for which the base current of said transistor is approximately zero.

2. The method in accordance with claim 1 wherein:
    during said desaturation time interval, a voltage corresponding approximately to said cut-off voltage is applied to the base of said transistor.

3. A method in accordance with claim 1 wherein said method is carried out via a driver stage which is connected to the base of said transistor and includes further transistors arranged in a push-pull configuration and wherein:
    said steps of applying said control voltage and said cut-off voltage are carried out by selectively turning-on and cutting-off said further transistors; and
    said step of applying said further voltage is carried out by cutting-off said further transistors during said desaturation interval.

4. A device for driving at least one transistor which is operated in saturation comprising:
    a first means for coupling to its output one of a control voltage, a cut-off voltage and a further voltage, said output being connected to the base of said transistor and said control, cut-off and further voltages being such that said transistor is cut-off during the presence of said cut-off voltage at said output, said transistor conducts current during the presence of said control voltage at said output, and the current to said base of said transistor is substantially zero during the presence of said further voltage at said output;
    and second means for controlling said first means to provide at said output preceding the presence at said output of said cut-off voltage said further voltage for a predetermined desaturation time interval which depends upon the storage time of said transistor.

5. A device in accordance with claim 4 and further including:
a capacitor connected between said output and the base of said transistor.

6. A device in accordance with claim 5 in which said first means is a double-throw switch.

7. A device in accordance with claim 4 for driving a plurality of transistors arranged in Darlington configuration, one of which plurality of transistors is a driver transistor and the other of which is an output transistor, the device comprising:
connecting means for connecting said output to the base of said driver transistor and a diode connecting the base of said driver transistor to the base of said output transistor, said diode being poled in the forward direction of the collector-emitter path of said driver transistor.

8. A device in accordance with claim 7 wherein said diode is a Schottky diode.

9. A device in accordance with claim 7 wherein:
said connecting means includes a capacitor.

10. A device in accordance with claim 4 and further comprising:
a resistor connected to said output and adapted to be connected to a voltage approximately equal to said cut-off voltage.

* * * * *